(12) United States Patent
Gayles et al.

(10) Patent No.: US 6,191,618 B1
(45) Date of Patent: Feb. 20, 2001

(54) CONTENTION-FREE, LOW CLOCK LOAD DOMINO CIRCUIT TOPOLOGY

(75) Inventors: Eric Gayles, Folsom; Bharat Bhushan, Cupertino; Debashree Ghosh, Palo Alto, all of CA (US)

(73) Assignee: Intel Corporation, Santa Clara, CA (US)

( * ) Notice: Under 35 U.S.C. 154(b), the term of this patent shall be extended for 0 days.

(21) Appl. No.: 09/360,110

(22) Filed: Jul. 23, 1999

(51) Int. Cl.$^7$ .................................................. H03K 19/096
(52) U.S. Cl. .................................................. 326/95; 326/98
(58) Field of Search .................................. 326/93, 95, 98, 326/112, 119, 121

(56) References Cited

U.S. PATENT DOCUMENTS

| | | | |
|---|---|---|---|
| 5,258,666 | * 11/1993 | Furuki | 307/449 |
| 5,898,330 | * 4/1999 | Klass | 327/210 |
| 6,075,386 | * 6/2000 | Naffziger | 326/98 |

\* cited by examiner

*Primary Examiner*—Jon Santamauro
*Assistant Examiner*—Anh Tran
(74) *Attorney, Agent, or Firm*—Blakely, Sokoloff, Taylor & Zafman LLP (57) ABSTRACT

A domino logic circuit includes a first domino gate that evaluates one or more inputs responsive to a clock signal, a reset gate, and a second domino gate having a first input coupled to the output of the first domino gate. A first input of a reset gate is coupled to the output of the first domino gate, with a second input of the reset gate being coupled to the output of the second domino gate. The reset gate outputs a precharge signal coupled to a second input of the second domino gate when the second domino gate is discharged and the output of the first domino gate changes state such that a high-to-low transition occurs at the first input of the second domino gate.

20 Claims, 5 Drawing Sheets

CONTENTION-FREE, LOW CLOCK LOAD DOMINO CIRCUIT TOPOLOGY

FIELD OF THE INVENTION

This invention relates to the field of digital electronic circuits; in particular, to domino logic circuits designed for high-speed operation.

BACKGROUND OF THE INVENTION

One recent innovation in circuit design methodology has been the development of the so-called "domino" and cascode voltage switch family of logic circuits. Domino logic circuits increase speed performance by electrically precharging a series of logic gates during a first clock phase, and then evaluating the intended logic function during the next clock phase. The critical speed path is pipelined in domino logic circuits so that one portion of the domino gates is precharging while another portion is evaluating. Examples of CMOS domino logic circuits are found in U.S. Pat. Nos. 5,517,136, 4,700,086 and 5,369,621. Various techniques for enhancing speed performance in CMOS domino logic circuits are further described in U.S. Pat. Nos. 5,121,003, 5,208,490 and 5,343,090.

As feature sizes of CMOS process technology shrinks, current density, power consumption and clock loading become significant problems in logic circuit design. Consider the traditional domino logic circuit shown in FIG. 1. Domino logic circuit 100 comprises a first domino gate (D1) that provides an output that drives a second domino gate (D2), and so on down the chain. Each domino logic gate consists of two main components: a precharge p-type field-effect device having its gate coupled to an input clock signal, and a conditional pull-down n-type device stack that evaluates a set of inputs. the case of the D1 domino gate, the p-type pull-up device 101 is shown being coupled between the positive supply, $V_{cc}$, and output node 115. The n-channel device stack 112 is coupled in series with clocked n-type transistor 114 between node 115 and ground. The inputs to be evaluated by device stack 112 are denoted by signal lines $A_0$–$A_N$. The D2 domino gate is similarly arranged, with a p-type device 121 being coupled between $V_{cc}$ and node 125. N-channel device stack 122 having inputs $B_0$–$B_M$ is coupled in series with n-type device 124 between node 125 and ground. An additional input is provided at node 120, generated by the D1 gate at output node 115 via inverter 117. Likewise, the D2 output provided at node 125 is coupled through inverter 127 to node 127.

Figure 1:
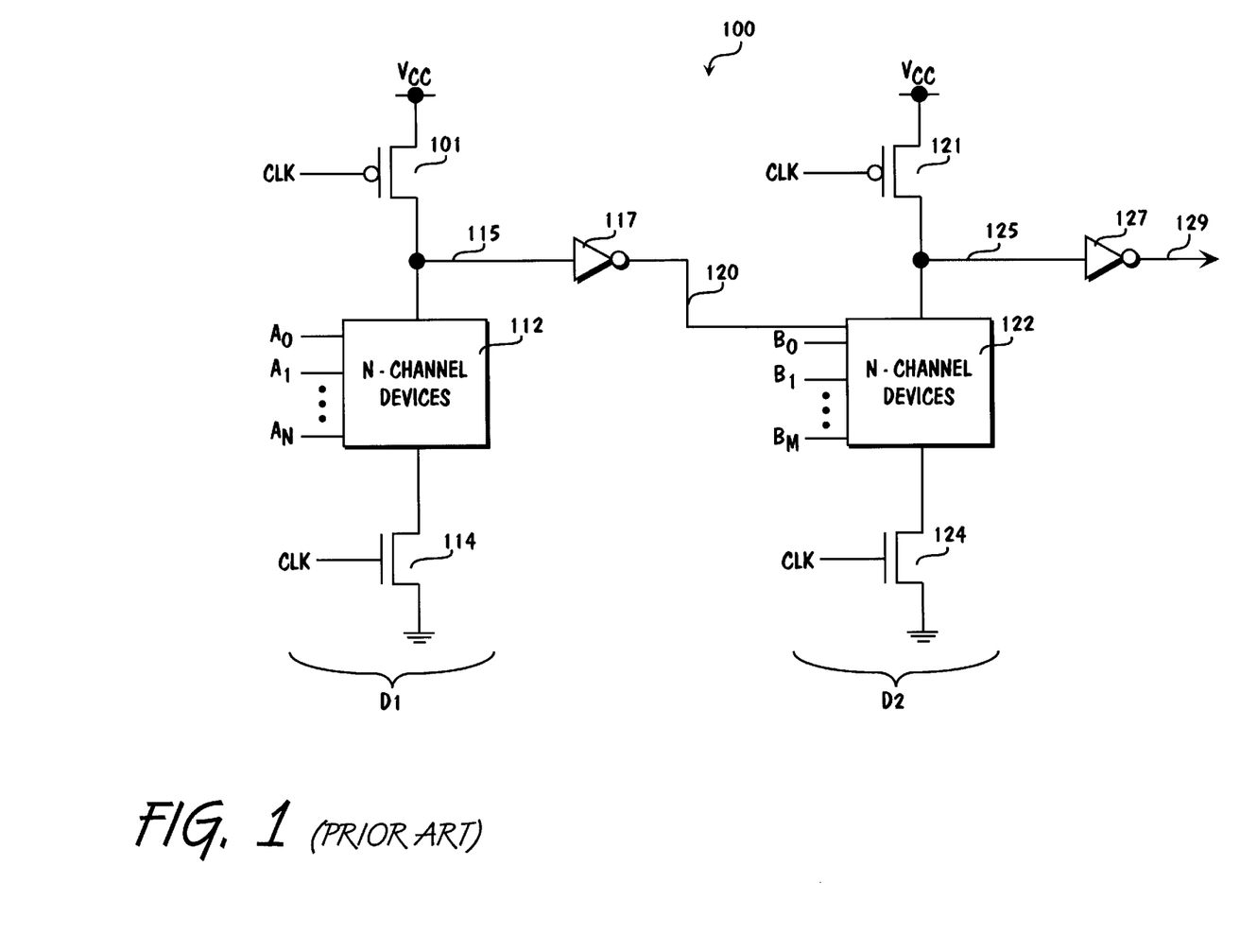
FIG. 1 is a circuit schematic diagram of a prior art domino circuit.

As mentioned above, the device stack is utilized to evaluate the input logic signals. Included in the device stack is an n-type field-effect device coupled in series between the n-type transistors and ground, with the gate of the n-type device also being coupled to a clock signal.

Operation of the traditional domino logic circuit 100 of FIG. 1 is relatively simple. When the clock signal coupled to the gates of devices 101, 114,121 and 124 is low, the pipeline circuitry is in a precharge phase. Domino output nodes 115 and 125 are precharged to a high potential during this precharge phase. The signal levels of inputs $A_0$–AN and $B_0$–$B_M$ are unimportant during the precharge stage, since the n-type devices coupled between the output nodes (115 and 125) and ground are nonconducting, i.e., "off". When the clock signal transitions high, domino output nodes 115 and 125 are no longer actively driven by the p-type field-effect pull-up device. In the case where the inputs $A_0$–$A_N$ satisfy certain logic conditions, the output node 115 is discharged and the input to the second domino gate transitions high. Similarly, if input node 120 and inputs $B_0$–$B_M$ satisfy certain logic conditions, output node 125 is discharged and node 129 transitions high. Thus, when the clock signal (CLK) is high, the domino logic circuit is in an evaluation phase.

It should be appreciated that the input signals to the domino gates should be stable or monotonically rising during the evaluation phase, otherwise the domino nodes may be discharged incorrectly.

There are several problems with the traditional domino logic circuitry of FIG. 1. First of all, a clock signal (or its complement) triggers all the precharge devices, which loads the clock lines severely. Furthermore, there is a large current spike in the power network when the domino logic gate enters the precharge phase due to all of the precharge devices being synchronized by the clock edge pulse. This requires a very robust power network and decoupling capacitors may be required. In addition, race conditions may exist when the domino pipeline chain drives a static latch. For example, if output node 129 enters a high-phase latch, which is open when the clock is high, then when the clock transitions low, precharged values may override the latch data if the latch turns off late.

Thus there is a need for an improved domino logic pipeline circuit that overcomes the drawbacks of the prior art.

SUMMARY OF THE INVENTION

The present invention provides a domino logic circuit comprising a first domino gate that evaluates one or more inputs, and provides an output responsive to a clock signal. The domino logic circuit further includes a second domino gate having a first input coupled to the output of the first domino gate. The second domino gate also has a second input and an output. A first input of a reset gate is coupled to the output of the first domino gate. A second input of the reset gate is coupled to the output of the second domino gate. The output of the reset gate provides a precharge signal coupled to the second input of the second domino gate when the output of the second domino gate is discharged and the output of the first domino gate changes state such that a high-to-low transition occurs at the first input of the second domino gate.

BRIEF DESCRIPTION OF THE DRAWINGS

The present invention is illustrated by way of example, and not limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention.

The present invention provides a novel domino pipeline circuit that utilizes static logic gates to trigger the resetting of a D2 domino logic gate by sensing appropriate input levels. The main purpose of the static logic gate is to precharge the second and subsequent D2 stages, obviating the need for a clock input signal coupled to all of the D2 domino gates in the domino chain.

Figure 2:
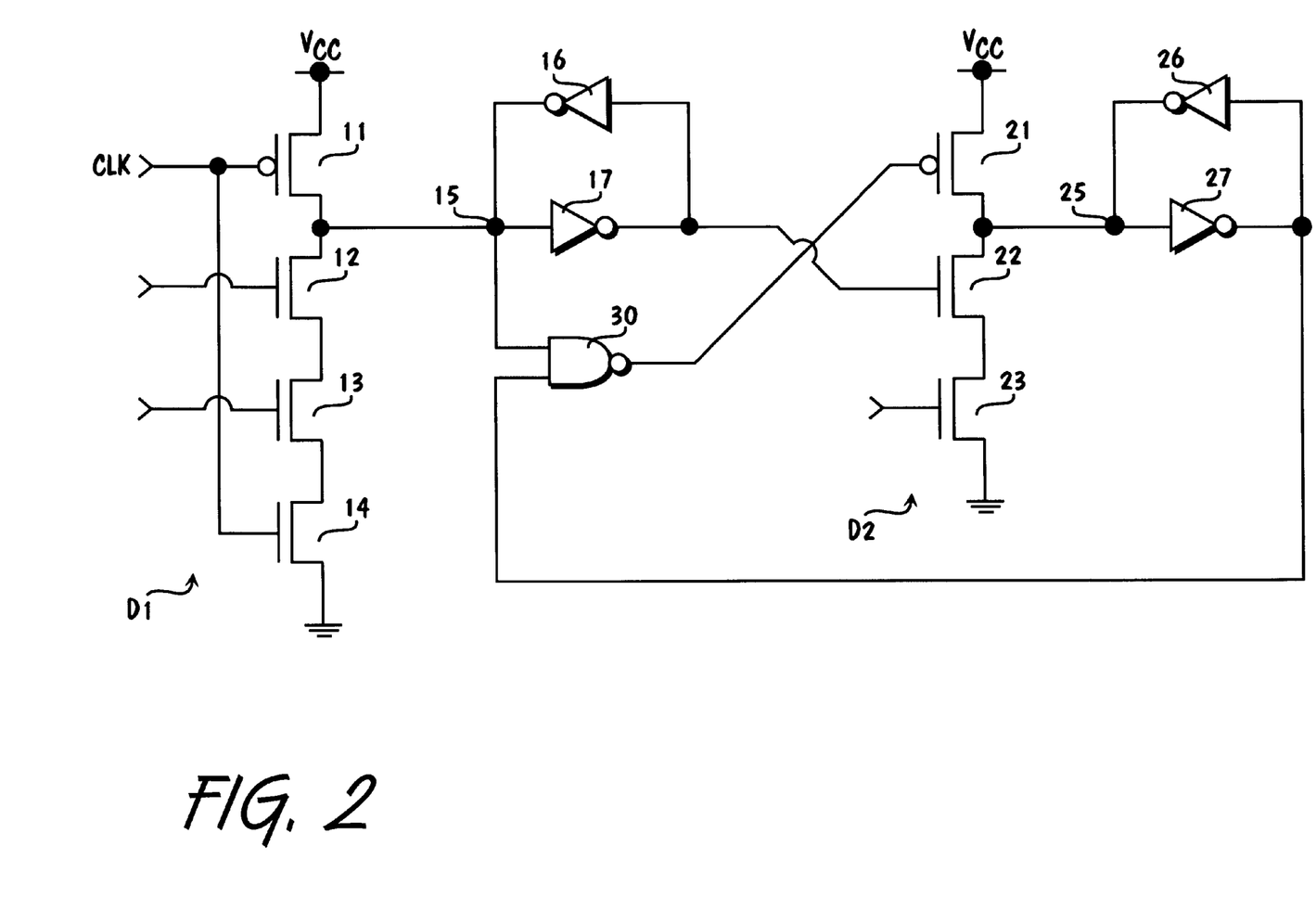
FIG. 2 is a circuit schematic diagram of one embodiment of the present invention.

FIG. 2 illustrates a circuit schematic diagram of one embodiment of the present invention. In this case, the D1 domino gate comprises a p-type field-effect device 11 coupled in series between the positive supply potential, $V_{cc}$, and output node 15. Coupled in series between node 15 and ground are a series of n-type field-effect devices 12–14. Transistor devices 12 and 13 provide logic inputs for evaluation, while the gate of device 14 and the gate of transistor device 11 are both coupled to an input clock signal. The output provided at node 15 is latched by a cross coupled pair of inverters 16 and 17. The output of inverter 17 is coupled to the input of n-type field-effect device 22 of the D2 domino gate.

Unlike the prior art design, the D2 domino gate of the present invention comprises a p-type field-effect transistor 21 coupled between $V_{cc}$ and output node 25, but with its input coupled to the output of CMOS NAND gate 30. In addition, there is no n-type device that is clocked in the D2 domino gate. Rather, n-type devices 22 and 23 are coupled in series between output node 25 and ground to evaluate a second set of logic inputs.

The D2 domino gate of FIG. 2 also includes a pair of cross-coupled inverters 26 and 27 coupled to node 25 to latch the output value. It should be understood that the use of cross coupled inverters for latching the outputs of each of the domino gates is an optional consideration and is provided only as a generalized design approach compatible with the present invention. In certain applications, the use of cross-coupled inverters may not be needed or desired.

Note that the two inputs to NAND gate 30 are provided from nodes 15 and 27; that is, the inputs to the precharge NAND gate are provided by the outputs of the D1 and D2 domino gates. The NAND gate 30 operates by precharging the D2 domino gate through transistor 21 when both the output of the D2 gate is discharged and the sensed input to the D2 gate is low. In other words, when both of the inputs of NAND gate 30 are high, the output of gate 30 is low, thereby enabling node 25 to be precharged high through transistor 21. The precharge signal provided by NAND gate 30 switches high after the output at node 25 is set to the supply voltage.

Practitioners in the art will appreciate that the circuit schematic design of FIG. 2 advantageously eliminates the clock input signal to all of the D2 domino gates in the pipelined chain of logic. Precharging of individual D2 gates only occurs on a conditional basis; that is, when the D2 output is low and the D1 driving domino gate transitions in such a way as to sense a low input to the D2 gate.

The invention exemplified by the embodiment of FIG. 2 provides further advantages in that the D2 domino gates operate at a much faster speed. The reason why is because there is no need for an extra n-type field-effect device coupled in series with the evaluation logic devices and driven by an input clock signal. As previously discussed, there is much less clock loading because the present invention obviates the need for a clock signal line to the D2 pull-up devices as well as the D2 pull-down devices.

Moreover, the present invention provides a time borrowing advantage in between pipeline stages. Precharging moves through the logic in a more or less pipelined manner instead of affecting all gates at the same time. In other words, precharging just affects the gates having a certain input/output state just prior to a particular transition. According to the scheme of the present invention, even when precharging commences, the gates at the end of the pipeline stage will still be ready following their computation.

Figure 3:
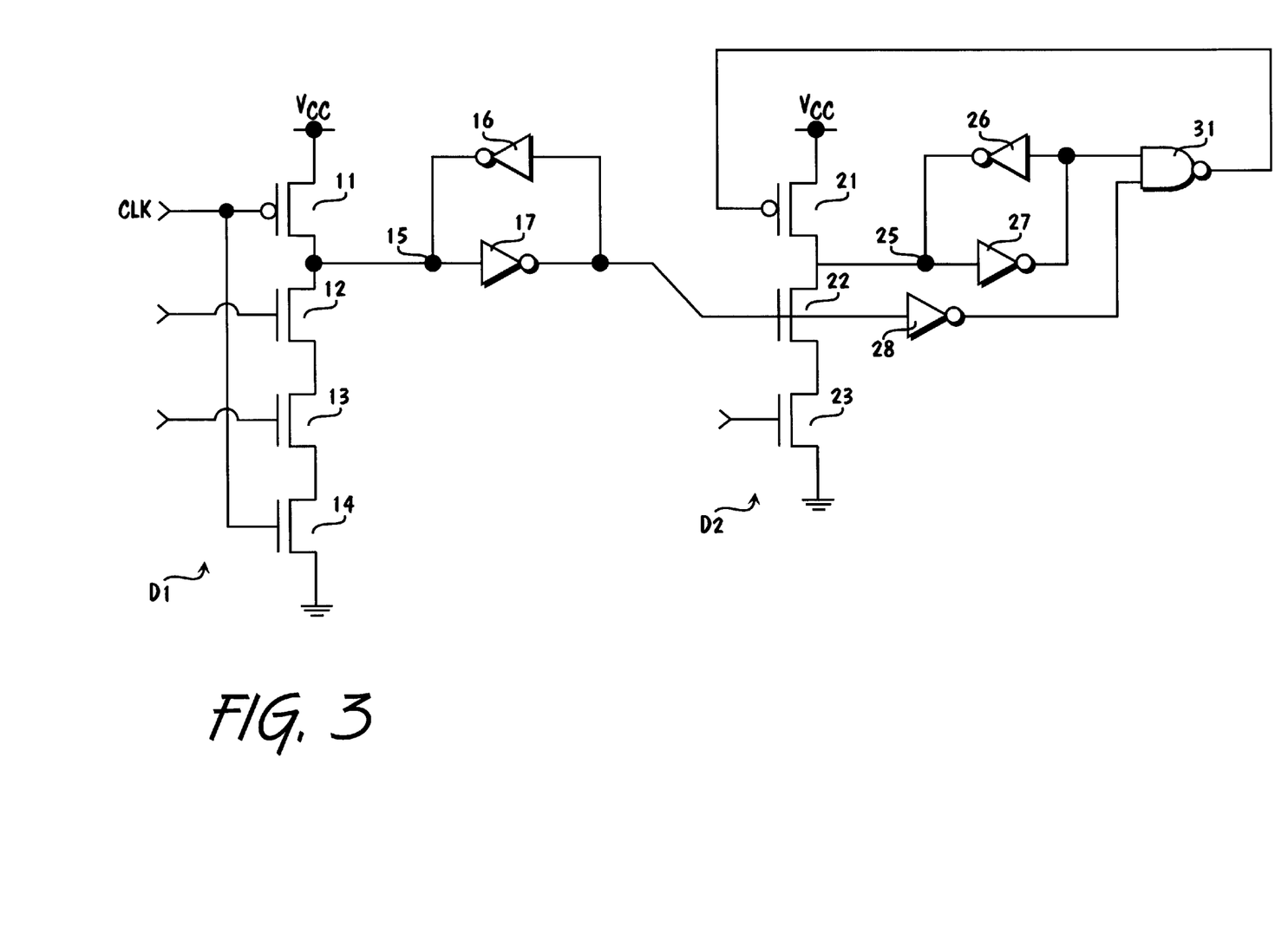
FIG. 3 is a circuit schematic diagram of an alternative embodiment of the present invention.

FIG. 3 illustrates a circuit schematic diagram of an embodiment of the present invention that provides a delayed precharge signal. In FIG. 3, the D1 and D2 domino gates are identical to that described previously with respect to FIG. 2. The precharge signal, however, is developed differently. In the embodiment of FIG. 3, inverters 27 and 28 produce the inputs provided to CMOS NAND gate 31. The output of NAND gate 31 is once again coupled to the gate of p-type device 21. Inverter 27 comprises one of the cross-coupled inverters 26 and 27 coupled to the output node of the D2 domino gate. Inverter 28, however, has its input coupled to the output of inverter 17, and also to the gate of n-type device 22.

This configuration provides a delayed precharge in cases where there may be a concern about the precharge signal arriving too early. For example, there may be applications in which the circuit of FIG. 3 is useful at the last stage of the pipeline logic chain. Note that when you start to precharge one stage, the next stage is beginning to evaluate. In this situation, it may be desirable to keep the input of the second stage stable for an additional gate delay. This may be achieved using the embodiment as shown in FIG. 3.

Figure 4:
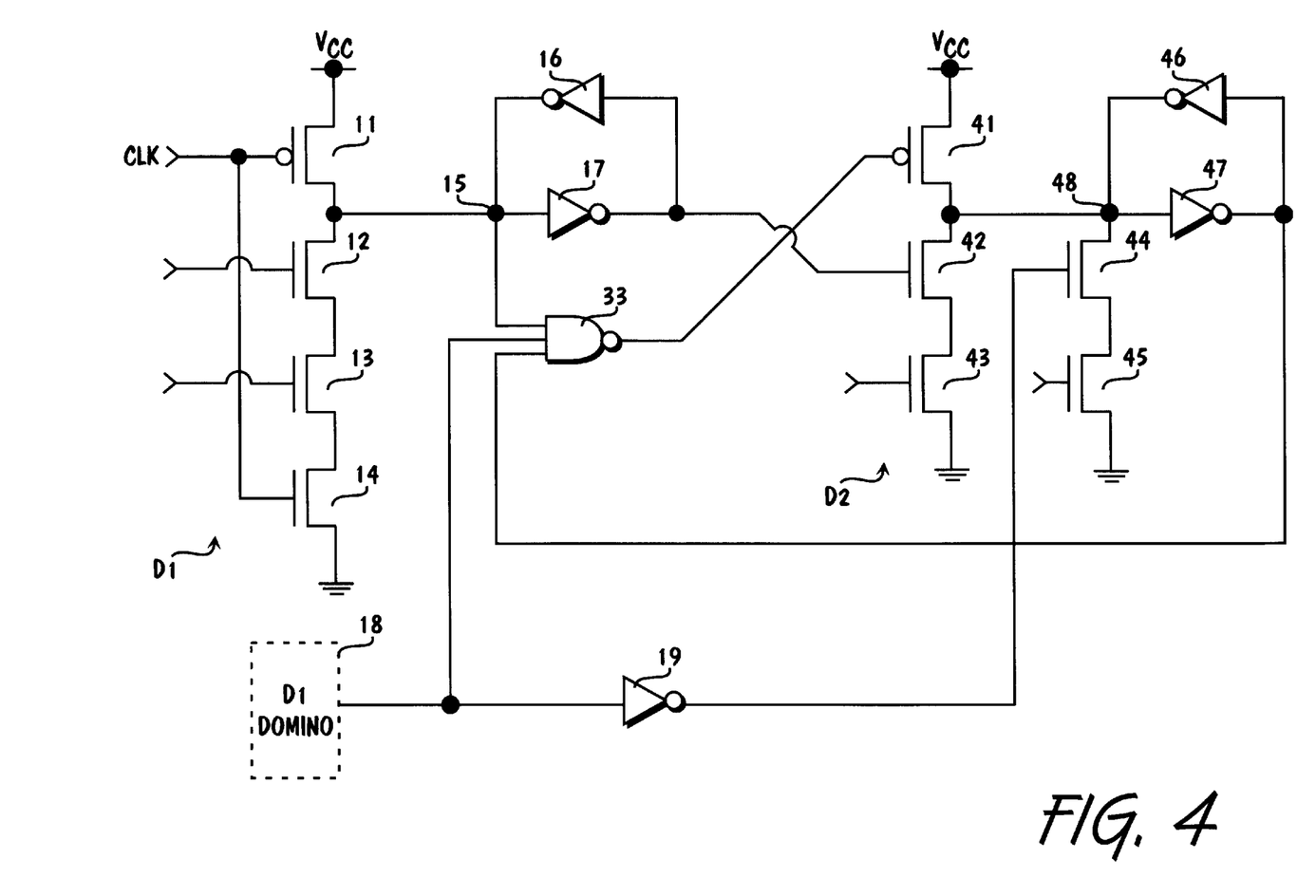
FIG. 4 is a circuit schematic diagram of an embodiment of the present invention where the second domino stage implements a logical NOR function.

The circuit schematic diagram shown in FIG. 4 illustrates a more generalized case where there are parallel pull-down paths in the D2 logic gate. In this situation, the D2 gates implement a NOR function, with two or more parallel discharge paths. As can be seen, the two parallel discharge paths consist of the n-type field-effect devices 42 and 43 coupled in series between node 48 and ground, and also devices 44 and 45 coupled between node 48 and ground. As before, a p-type pull-up transistor 41 is coupled between $V_{cc}$ and output node 48, with the gate of transistor 41 being coupled to the output of CMOS NAND gate 33. Cross-coupled inverters 46 and 47 are connected to output node 48 and also provide one of the three inputs to NAND gate 33. A second input to NAND gate 33 is provided by output node 15, while the third input to NAND gate 33 is provided by the D1 domino gate 18, which drives the second parallel pull-down path. The output of domino gate 18 is coupled through inverter 19 to the gate of p-type field-effect device 44.

It is appreciated that a three-input NAND gate 33 is required in the generalized embodiment of FIG. 4 since one input from each series path is selected for sensing purposes. The inputs to the inverters that generate the sensing inputs for the D2 domino gate are fed, along with the inverted D2 output, into static CMOS NAND gate 33. As is the case with the previous embodiments, the NAND gate generates the precharge signal coupled to the gate of the pull-up p-type device in the D2 domino gate. It will be appreciated that the additional input signal of static logic gate 33 eliminates contention between the various pull-down paths in the D2 domino gate.

FIG. 4 is a circuit schematic diagram showing an exemplary pipeline structure of the present invention. Each pipeline stage begins with a D1 domino gate, e.g., gates 50 and 53 for the first and second stages, respectively. The D1 domino gates are followed in each pipeline stage by one or more D2 domino gates, e.g., gates 51, 52 in the first pipeline stage, and gates 54, 55 in the second pipeline stage. Whereas the D1 domino gate 50 of the first pipeline stage is driven by the clock signal CLK, the D1 domino gate 53 of the second (and successive) pipeline stage is triggered by the complementary clock signal (CLK#) as produced by inverter 60 in FIG. 5. Static CMOS logic gates 30a–30d are used to drive each of the individual D2 domino gates 51, 52 and 54, 55, respectively. In addition, inverters 20a–20e provide evaluate input signals to the D2 domino gates.

Figure 5:
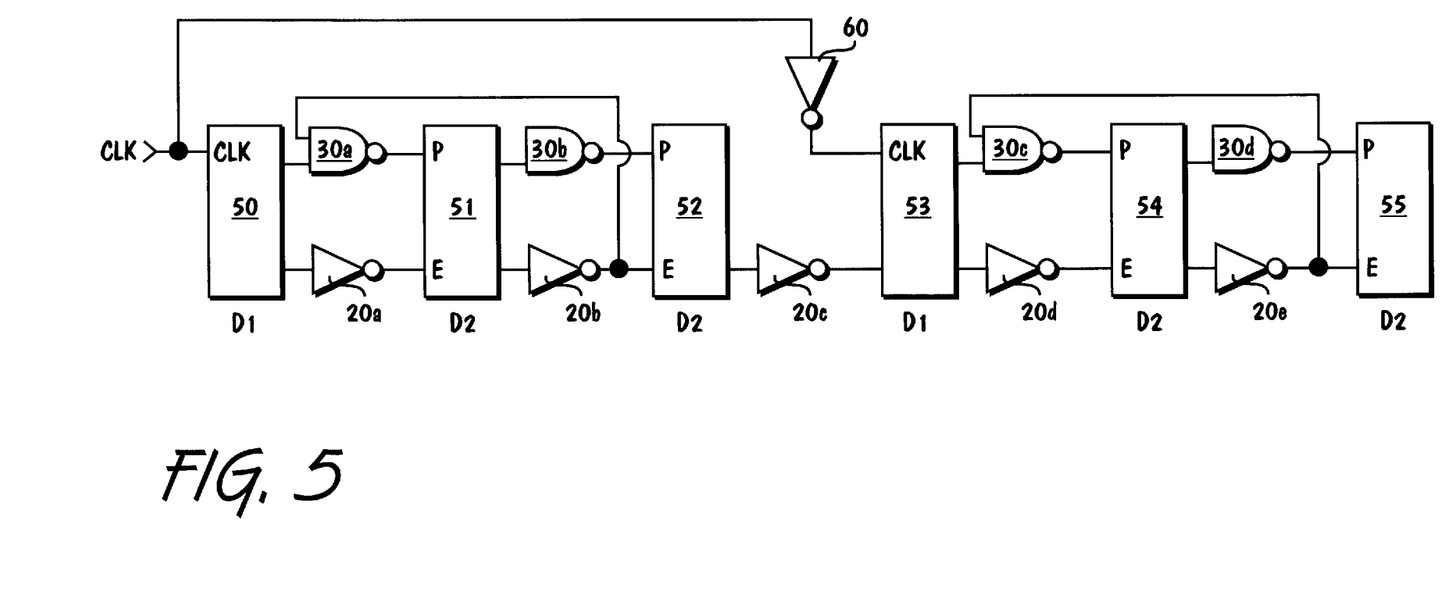
FIG. 5 is an exemplary pipeline structure in accordance with the present invention.

In the generalized pipeline structure shown in FIG. 5 it is important to understand that clock signals only drive the D1 domino gates which start a pipeline stage. In this respect, the D1 domino gate 53 which begins the second pipeline stage can also be considered as a middle D1 domino gate for the clock cycle, as opposed to the first D1 domino gate of the clock phase. The D1 domino gates initiate the evaluation of the second half of the domino logic shown in FIG. 5. The D2 domino gates 51, 52 and 54, 55 are not driven by clock signals at all. Therefore, the embodiment of FIG. 5 represents a significant reduction in clock loading over traditional domino logic schemes.

Another important observation is that the sensing scheme for precharging the D2 domino gates is contention free. This means that a current path from the high supply potential ($V_{cc}$) to ground does not exist within any of the D2 domino gates. In contrast, traditional domino schemes exhibit this potential problem.

As previously discussed, the present invention also removes the latch requirement in the pipeline, which further reduces clock loading. It also provides an opportunity for time borrowing across pipeline stage boundaries, as long as the reset delay is longer than duty cycle skew. Additionally, the early sampling if the sensing signal relative to the data inputs for the D2 domino gates minimizes precharge time constraints within a piped stage.

Thus, the present invention provides a simple domino design with reduced clocking requirements.

It should be understood that although the present invention has been described in conjunction with specific embodiments, numerous modifications could be made without departing from the scope of the present invention. Accordingly, the specification and drawings are to be regarded in an illustrative rather than a restrictive sense.

We claim:

1. A domino logic circuit comprising:
   a first domino gate that evaluates one or more inputs, and provides an output, responsive to a clock signal;
   a second domino gate having a first input coupled to the output of the first domino gate, a second input, and an output; and
   a reset gate having a first input coupled to the output of the first domino gate, a second input coupled to the output of the second domino gate, and an output that provides a precharge signal coupled to the second input of the second domino gate when the output of the second domino gate is discharged and the output of the first domino gate changes state such that a high-to-low transition occurs at the first input of the second domino gate.

2. The domino logic circuit of claim 1 wherein the first domino gate comprises a first PMOS device coupled in series with a first NMOS device between a supply potential and ground, the gates of both the first PMOS and first NMOS devices being coupled to the clock signal.

3. The domino logic circuit of claim 2 wherein the first domino gate further comprises one or more additional NMOS devices coupled in series between the first PMOS and first NMOS devices, the gates of the one or more additional NMOS devices providing the one or more inputs.

4. The domino logic circuit of claim 1 wherein the reset gate comprises a static CMOS NAND gate.

5. The domino logic circuit of claim 1 wherein the second domino gate comprises a second PMOS device coupled between the supply potential and the output of the second domino gate, the gate of the second PMOS device providing the second input of the second domino gate.

6. The domino logic circuit of claim 5 wherein the second domino gate further comprises a second NMOS device coupled between the output of the second domino gate and ground, the gate of the second NMOS device providing the first input of the second domino gate.

7. The domino logic circuit of claim 6 wherein the second domino gate further comprises a third NMOS device coupled in series between the second NMOS device and ground, the gate of the third NMOS device providing a third input such that the output of the second domino gate is a logical NAND function of the second and third inputs.

8. The domino logic circuit of claim 1 further comprising first and second latch circuits coupled to latch the outputs of the first and second domino gates, respectively.

9. The domino logic circuit of claim 8 wherein the latch circuits each comprise a pair of cross-coupled inverters.

10. A domino logic circuit comprising:
    a pair of first stage domino gates, each having one or more inputs, and an output that represents a logical function of the one or more inputs, the output evaluating the logical function responsive to a clock signal;
    a second stage domino gate having a first PMOS device coupled between a supply potential and an output, and first and second NMOS devices coupled in parallel between the output of the second stage domino gate and ground, the gates of the first and second NMOS devices each being respectively coupled to one of the outputs of the pair of first stage domino gates; and
    a reset gate having first and second inputs respectively coupled to one of the outputs of the pair of first stage domino gates, and an output that provides a precharge signal coupled to the gate of the first PMOS device when the output of the second stage domino gate is discharged and the gates of the first and second NMOS devices are both low.

11. The domino logic circuit of claim 10 wherein the pair of first stage domino gates each comprise a PMOS device coupled in series with a NMOS device between the supply potential and ground, the gates of both the PMOS and NMOS devices being coupled to the clock signal.

12. The domino logic circuit of claim 11 wherein each of the pair of first stage domino gates further comprises one or more additional NMOS devices, the gates of the one or more additional NMOS devices providing the one or more inputs.

13. The domino logic circuit of claim 10 wherein the reset gate comprises a static CMOS NAND gate.

14. The domino logic circuit of claim 10 wherein the second stage domino gate further comprises third and fourth NMOS devices respectively coupled between the first and second NMOS devices and ground.

15. The domino logic circuit of claim 10 further comprising first, second and third latch circuits coupled to latch the outputs of the pair of first stage and second stage domino gates, respectively.

16. The domino logic circuit of claim 15 wherein the latch circuits each comprise a pair of cross-coupled inverters.

17. A domino pipeline comprising:

a plurality of pipeline stages, each pipeline stage comprising a first domino gate coupled to a series of one or more second domino gates;

each of the second domino gates having a precharge input, an evaluate input, and an output, the precharge input of each second domino gate being driven by a corresponding NAND gate having a first input coupled to an output of a preceding gate and a second input coupled to the output of the second domino gate such that the precharge input is asserted when the output of the second domino gate is discharged and the output of the preceding gate transitions in a way so as to drive the output of the second domino gate high; and wherein each of the first domino gates is clocked and each of the second domino gates is not clocked.

18. The domino pipeline of claim 17 wherein the first domino gate of a first pipeline stage is driven by a first clock signal, and the first domino gate of a second and each successive pipeline stages is driven by a second clock signal.

19. The domino pipeline of claim 18 wherein the second clock signal is a complement of the first clock signal.

20. The domino pipeline of claim 17 wherein the preceding gate comprises either a first domino gate or a second domino gate.

* * * * *

UNITED STATES PATENT AND TRADEMARK OFFICE
CERTIFICATE OF CORRECTION

PATENT NO. : 6,191,618 B1
DATED : February 20, 2001
INVENTOR(S) : Gayles et al.

It is certified that error appears in the above-identified patent and that said Letters Patent is hereby corrected as shown below:

Column 1,
Line 35, before "the case", insert -- In --.

Signed and Sealed this

Thirtieth Day of September, 2003

JAMES E. ROGAN
*Director of the United States Patent and Trademark Office*